United States Patent
Wan et al.

(10) Patent No.: US 12,167,584 B2
(45) Date of Patent: Dec. 10, 2024

(54) MASK STRUCTURE, SEMICONDUCTOR STRUCTURE AND MANUFACTURING METHOD

(71) Applicant: CHANGXIN MEMORY TECHNOLOGIES, INC., Hefei (CN)

(72) Inventors: Qiang Wan, Hefei (CN); Jun Xia, Hefei (CN); Penghui Xu, Hefei (CN); Tao Liu, Hefei (CN); Sen Li, Hefei (CN); Kangshu Zhan, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 596 days.

(21) Appl. No.: 17/448,524

(22) Filed: Sep. 23, 2021

(65) Prior Publication Data

US 2022/0310607 A1    Sep. 29, 2022

Related U.S. Application Data

(63) Continuation of application No. PCT/CN2021/107754, filed on Jul. 22, 2021.

(30) Foreign Application Priority Data

Mar. 29, 2021 (CN) .......................... 202110336053.0

(51) Int. Cl.
  *H10B 12/00* (2023.01)
  *H01L 21/027* (2006.01)
  *H01L 21/308* (2006.01)

(52) U.S. Cl.
  CPC ....... *H10B 12/0387* (2023.02); *H01L 21/027* (2013.01); *H01L 21/308* (2013.01); *H10B 12/30* (2023.02)

(58) Field of Classification Search
  CPC .. H10B 12/0387; H10B 12/30; H10B 12/033; H01L 21/027; H01L 21/308; H01L 28/90; H01L 21/0337; H01L 21/31144
  See application file for complete search history.

(56) References Cited

U.S. PATENT DOCUMENTS

| | | | | |
|---|---|---|---|---|
| 9,012,326 B2 * | 4/2015 | Kim | ................. | H01L 29/66666 |
| | | | | 257/E21.585 |
| 10,879,129 B2 * | 12/2020 | Fu | ..................... | H01L 29/66742 |

(Continued)

FOREIGN PATENT DOCUMENTS

| | | | | |
|---|---|---|---|---|
| CN | 101546694 A | | 9/2009 | |
| CN | 103779191 A | * | 5/2014 | ........... H01L 21/033 |

(Continued)

OTHER PUBLICATIONS

CN Search Report in Application No. 2021103360530, issued on Mar. 3, 2022.

(Continued)

*Primary Examiner* — Kyoung Lee
*Assistant Examiner* — Sophia W Kao
(74) *Attorney, Agent, or Firm* — Syncoda LLC; Feng Ma

(57) ABSTRACT

A method for manufacturing a mask structure includes: patterning a sacrificial layer and a second dielectric layer, so as to form pattern structures each including a first pattern and a second pattern, and a width of a lower portion of the pattern structures is less than a width of a upper portion of the pattern structures; forming an initial mask pattern on sidewalls of each of the plurality of pattern structures; filling a first filling layer between adjacent initial mask patterns located on the sidewalls of different pattern structures; removing the second patterns and the initial mask pattern located on sidewalls of each of the plurality of second patterns; removing the first filling layer and the first patterns, (Continued)

so as to form first mask patterns; and forming second mask patterns on the first mask patterns.

13 Claims, 8 Drawing Sheets

(56) References Cited

U.S. PATENT DOCUMENTS

| | | | | |
|---|---|---|---|---|
| 2008/0299776 A1* | 12/2008 | Bencher | ............ | H01L 21/31144 |
| | | | | 257/E21.235 |
| 2016/0209749 A1* | 7/2016 | Yamamoto | ................ | G03F 7/40 |
| 2016/0329207 A1 | 11/2016 | Mohanty et al. | | |

FOREIGN PATENT DOCUMENTS

| | | | |
|---|---|---|---|
| CN | 105593762 A | 5/2016 | |
| CN | 103779191 B | 8/2016 | |
| CN | 108206131 A | 6/2018 | |
| CN | 111524795 A | 8/2020 | |
| CN | 111986983 A | 11/2020 | |
| CN | 112017950 A | 12/2020 | |
| CN | 112133625 A * | 12/2020 | ........... H01L 21/027 |
| CN | 112447603 A | 3/2021 | |
| CN | 113097141 A | 7/2021 | |
| JP | H0645590 A | 2/1994 | |

OTHER PUBLICATIONS

International Search Report in Application No. PCT/CN2021/107754, mailed on Dec. 27, 2021.

* cited by examiner

MASK STRUCTURE, SEMICONDUCTOR STRUCTURE AND MANUFACTURING METHOD

CROSS-REFERENCE TO RELATED APPLICATIONS

This is a continuation of International Application No. PCT/CN2021/107754 filed on Jul. 22, 2021, which claims priority to Chinese Patent Application No. 202110336053.0 filed on Mar. 29, 2021. The disclosures of these applications are hereby incorporated by reference in their entirety.

BACKGROUND

With the rapid development of semiconductor storage technologies, there are increasingly higher requirements for the storage capacity of semiconductor storage products in the market. For Dynamic Random-Access Memory (DRAM), the distribution density of storage capacitors and the stored power quantity in a single capacitor restrict the storage capacity and stability of the capacitor memory.

SUMMARY

The present disclosure relates generally to the field of integrated circuit and electronic component manufacturing, and more specifically to a mask structure, a semiconductor structure and a manufacturing method.

According to some embodiments, a mask structure, a semiconductor structure and a manufacturing method are provided.

A method for manufacturing a mask structure includes:
- a first dielectric layer, a sacrificial layer and a second dielectric layer which are sequentially stacked from bottom to top are formed;
- the sacrificial layer and the second dielectric layer are patterned, so as to form a plurality of pattern structures, and each of the plurality of pattern structures includes a first pattern and a second pattern which are sequentially stacked from bottom to top, and a width of a lower portion of the first patterns is less than a width of an upper portion of the first patterns;
- an initial mask pattern is formed on sidewalls of each of the plurality of pattern structures;
- a first filling layer is filled between adjacent initial mask patterns located on the sidewalls of different pattern structures;
- the second patterns and the initial mask patterns located on sidewalls of each of the plurality of second patterns are removed;
- the first filling layer and the first patterns are removed, so as to form first mask patterns on an upper surface of the first dielectric layer, and the first mask patterns extend in a first direction; and
- second mask patterns are formed on the first mask patterns, and the second mask patterns extend in a second direction, and the second direction intersects with the first direction.

A method for manufacturing a semiconductor structure includes:
- a substrate is provided;
- a material layer to be etched is formed on the substrate;
- target mask patterns are formed on an upper surface of the material layer to be etched by the described method for manufacturing a mask structure; and
- the material layer to be etched is etched based on the target mask patterns, so as to obtain a semiconductor structure.

A semiconductor structure, and the semiconductor structure is manufactured by the described method for manufacturing a semiconductor structure.

The above description is only an overview of the technical solutions of the present disclosure. In order to make the technical means of the present disclosure clearer and to implement the present disclosure according to the content of the description, the preferred embodiments of the present disclosure will be described in detail below in conjunction with the drawings.

BRIEF DESCRIPTION OF THE DRAWINGS

To describe the technical solutions in the embodiments of the present disclosure more clearly, drawings required for describing the embodiments will be introduced briefly below. Apparently, the drawings described below are merely some embodiments of the present disclosure, and those ordinary skilled in the art may still obtain other drawings from these drawings without creative efforts.

DETAILED DESCRIPTION

Figure 1A:
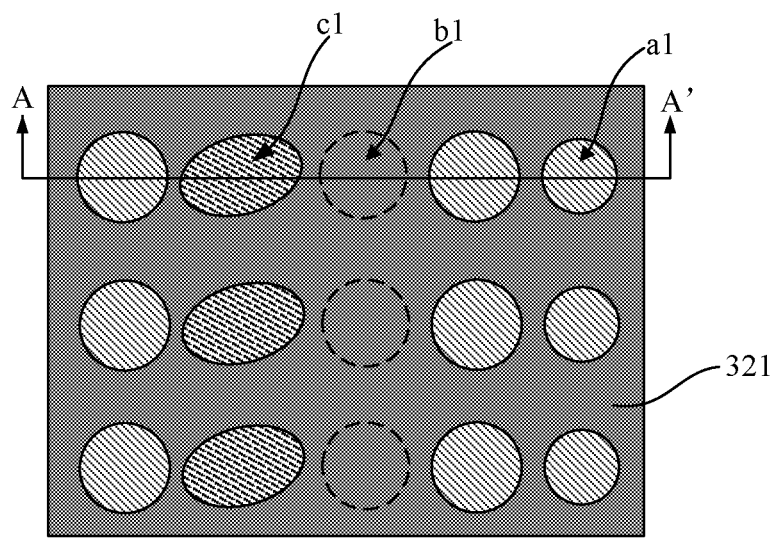
FIG. 1A is a structural schematic diagram of a top view a target mask layer.

In order to facilitate understanding of the present disclosure, the present disclosure will be described more fully hereinafter with reference to the drawings. Preferred embodiments of the present disclosure are shown in the drawings. In some embodiments, the present disclosure, however, is embodied in many different forms and is not limited to the embodiments set forth herein. Rather, these embodiments are provided so that the content of the present disclosure will be thorough and complete.

Unless defined otherwise, all technical and scientific terms used herein have the same meaning as commonly understood by those skilled in the art to which the present disclosure belongs. The terms used herein in the description of the present disclosure are for the purpose of describing particular embodiments only and are not intended to limit the present disclosure. As used herein, the term "and/or" includes any and all combinations of one or more of the associated listed items.

It should be understood that when an element or layer is referred to as "on . . . " "adjacent to . . . ", "connected to" or "coupled to" another element or layer, it can be directly on, adjacent to, connected to, or coupled to another element or layer, or intermediate elements or layers are present. In contrast, when an element is referred to as "directly on . . . ", "directly adjacent to . . . ", "directly connected to" or "directly coupled to" another element or layer, no intermediate element or layer is present. It should be understood that, although the terms, such as first, second and third, are used to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Spatially relative terms, such as "below . . . ", "under . . . ", "lower", "beneath", "above" and "upper" are used herein for ease of description to describe the relationship between one element or feature and another element or feature as shown in the drawings. It should be understood that the spatially relative terms are intended to encompass different orientations of the device in use and operation in addition to the orientation depicted in the drawings. For example, if the device in the drawings is turned over, then elements or features described as "under" or "beneath" or "below" other elements or features would then be oriented "above" the other elements or features. Thus, the exemplary terms "under . . . " and "below . . . " may encompass both the orientations of above and below. The device is otherwise oriented (90 degrees rotated or otherwise) and the spatial descriptors used herein are interpreted correspondingly.

The terms used herein are for the purpose of describing embodiments only and are not intended to limit the present disclosure. As used herein, the singular forms "a", "an" and "said/the" are intended to include the plural forms as well, unless the context clearly indicates otherwise. It should be further understood that the terms "consists" and/or "includes", when used in this description, specify the presence of stated features, integers, steps, operations, elements, and/or components, but do not preclude the presence or addition of one or more other features, integers, steps, operations, elements, components, and/or groups. As used herein, the term "and/or" includes any and all combinations of the associated listed items.

Embodiments of the disclosure are described herein with reference to cross-sectional views that are schematic illustrations of idealized embodiments (and intermediate structures) of the disclosure. As such, variations from the illustrated shapes due to, for example, manufacturing techniques and/or tolerances are expected. Thus, embodiments of the present disclosure should not be limited to the particular shapes of regions illustrated herein but include deviations in shapes that result, for example, from manufacturing. The regions illustrated in the drawings are schematic in nature and their shapes are not intended to be actual shapes of regions of a display device and are not intended to limit the scope of the present disclosure.

The inventors of the present disclosure have recognized that in a process of manufacturing capacitor holes in a capacitor memory, double layers of mask patterns generally need to be formed, the double layers of mask patterns are arranged regularly, and it can be seen from a top view that the double layers of mask patterns intersect with each other obliquely, and then the double layers of mask patterns are transferred to a target mask layer so as to define a capacitor pattern and manufacture a capacitor tube. Double layers of mask patterns manufactured subsequently present an inclined topography, and thus when the double layers of mask patterns are transferred downwards, defects such as different aperture sizes of capacitor holes manufactured, insufficient etching, and poor direction consistency of the capacitor holes are easily caused, resulting in a decreased stored power quantity in the capacitor, and finally affecting the wafer yield.

Figure 1B:
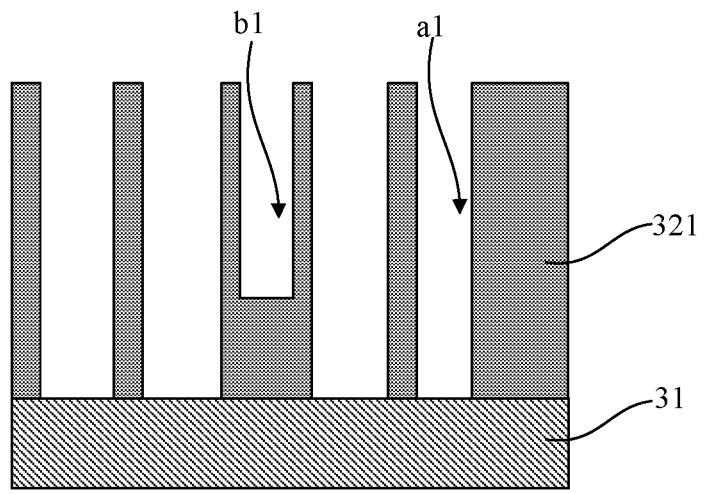
FIG. 1B is a schematic diagram of a partial cross-sectional view along the direction AA' in FIG. 1A.

Referring to FIG. 1A and FIG. 1B, in a process of forming a defined capacitor hole patterns with a Self-Aligned Double Patterning (SDAP) technology, as the SOH material itself has physicochemical properties such as softness and strong mobility, a pattern structure with a narrow upper portion and a wide lower portion is formed, and a mask layer 321 located on an upper surface of a substrate 31 is converted into a target mask layer in a pattern transfer process, so that capacitor holes formed by the capacitor pattern transfer have defects such as different aperture sizes (as indicated by a1 in FIG. 1A and FIG. 1B), insufficient etching (as indicated by b1 in FIG. 1) and poor direction consistency (as indicated by c1 in FIG. 1A and FIG. 1B), causing non-uniform thickness of an electrode and a capacitor dielectric layer under subsequent deposition, resulting in a decreased stored power quantity in the capacitor, thereby limiting the improvement of the wafer yield.

Referring to FIG. 2-FIG. 20B, it should be noted that, the illustrations provided in the present embodiments merely illustrate a basic concept of the present disclosure in a schematic manner. Although the illustration only shows components related to the present disclosure rather than plotting according to the number, shape and size of the components in actual implementation, the form, number and scale of the components in actual implementation are changed arbitrarily, and the layout form of the components may also be more complex.

Figure 2:
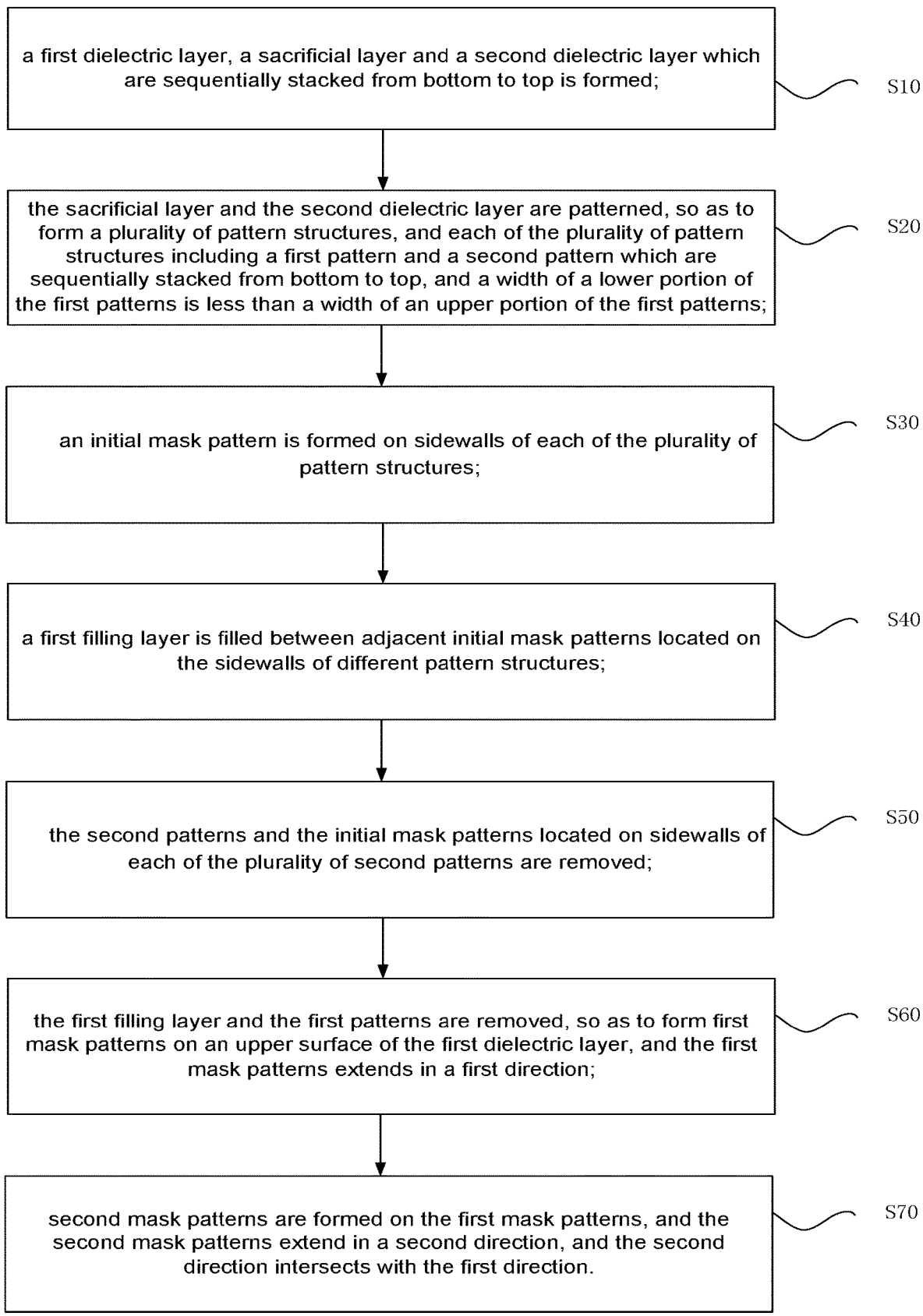
FIG. 2 is a schematic flowchart of a method for manufacturing a mask structure according to an embodiment of the present disclosure.

In an embodiment of the present disclosure, as shown in FIG. 2, a method for manufacturing a mask structure includes the following steps:

Step S10: a first dielectric layer, a sacrificial layer and a second dielectric layer which are sequentially stacked from bottom to top is formed;

Step S20: the sacrificial layer and the second dielectric layer are patterned, so as to form a plurality of pattern structures, and each of the plurality of pattern structures including a first pattern and a second pattern which are sequentially stacked from bottom to top, and a width of a lower portion of the first patterns is less than a width of an upper portion of the first patterns;

Step S30: an initial mask pattern is formed on sidewalls of each of the plurality of pattern structures;

Step S40: a first filling layer is filled between adjacent initial mask patterns located on the sidewalls of different pattern structures;

Step S50: the second patterns and the initial mask patterns located on sidewalls of each of the plurality of second patterns are removed;

Step S60: the first filling layer and the first patterns are removed, so as to form first mask patterns on an upper surface of the first dielectric layer, and the first mask patterns extends in a first direction; and Step S70: second mask patterns are formed on the first mask patterns, and the second mask patterns extend in a second direction, and the second direction intersects with the first direction.

In the method for manufacturing the mask structure provided in the embodiment above, the first dielectric layer, the sacrificial layer and the second dielectric layer which are stacked are sequentially formed, the sacrificial layer and the second dielectric layer are patterned, so as to form the pattern structures, and each of the plurality of pattern structures includes the first pattern and the second pattern which are sequentially stacked from bottom to top, and in an etching process, etching rates of etching the upper portion and the lower portion of the pattern structures are controlled, so that the width of the lower portion of the first patterns is less than the width of the upper portion of the first patterns; the initial mask pattern is formed on the sidewalls of each of the plurality of pattern structures, and the first filling layer is filled between the adjacent initial mask patterns located on the sidewalls of different pattern structures, so as to ensure that after the second patterns, the first filling layer and the initial mask patterns are removed by a subsequent etching, the reserved first filling layer can protect the first mask patterns from an inclination phenomenon; the first filling layer and the first patterns are removed, so as to form the first mask patterns on the upper surface of the first dielectric layer, and the first mask patterns extend in the first direction; and the second mask patterns on the first mask patterns are formed, and the second mask patterns extend in the second direction, and the second direction intersects with the first direction. The first mask patterns and the second mask patterns obtained based on the described manufacturing method are etched downwards as a mask, so as to obtain capacitor holes with a uniform aperture size and better direction consistency, thereby stored power quantity in a capacitor is increased, and a yield of wafer production is improved.

Figure 3:
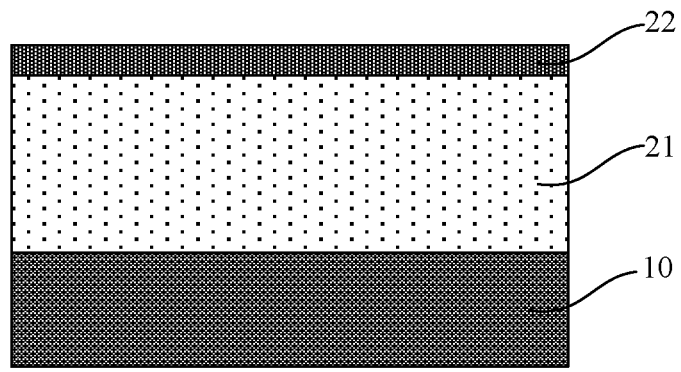
FIG. 3 is a schematic diagram of a partial cross-sectional view of formed a first dielectric layer, a sacrificial layer and a second dielectric layer according to an embodiment of the present disclosure.

As an example, as shown in FIG. 3, the sacrificial layer 21 provided in Step S10 includes, but is not limited to, a Spin-On hard mask (SOH) layer, the second dielectric layer 22 includes, but is not limited to, a silicon oxynitride (SiON) layer, and the first dielectric layer 10 is multi-layered, and the first dielectric layer 10 includes a substrate, a first support layer, a second support layer and a third support layer which are sequentially stacked from bottom to top. Specifically, the substrate includes, but is not limited to, a polycrystalline silicon substrate, the first support layer includes, but is not limited to, a silicon oxide layer, and the second support layer includes, but is not limited to, an Amorphous Carbon Layer (ACL).

Figure 4:
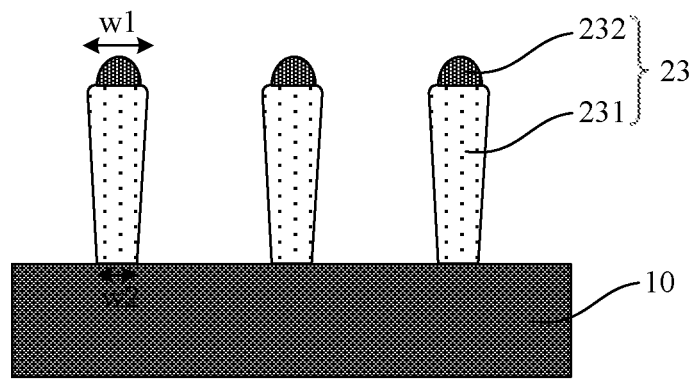
FIG. 4 is a schematic diagram of a partial cross-sectional view of formed pattern structures according to an embodiment of the present disclosure.

As an example, as shown in FIG. 4, in Step S20, the etching rates of the upper portion and the lower portion of the pattern structures 23 are controlled, and the etching rate of the upper portion is less than the etching rate of the lower portion, so that the width of the upper portion of the formed pattern structures 23 is greater than the width of the lower portion, that is, the width w1>the width w2. In a process of subsequently depositing a initial mask material layer 241, due to the physicochemical properties of the Spin-On hard mask (SOH) layer, the width of the upper portion of the formed pattern structures 23 and the width of the lower portion of the formed pattern structures 23 as shown in FIG. 5 are equal, and it can be ensured that the initial mask material layer 241 formed on the sidewalls of the pattern structures 23 is perpendicular to the first dielectric layer 10, so as to form the first mask patterns with a regular shape.

As an example, a shape of each of the plurality of second patterns 232 obtained by patterning the second dielectric layer 22 are semicircles as shown in FIGS. 4-8, or are rectangular structures.

Figure 5:
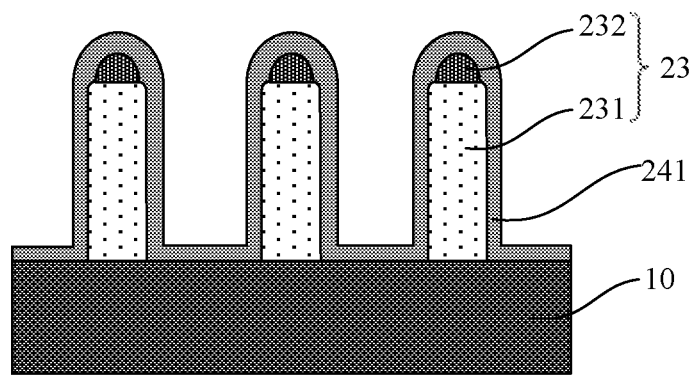
FIG. 5 is a schematic diagram of a partial cross-sectional view of formed an initial mask material layer according to an embodiment of the present disclosure.
Figure 6:
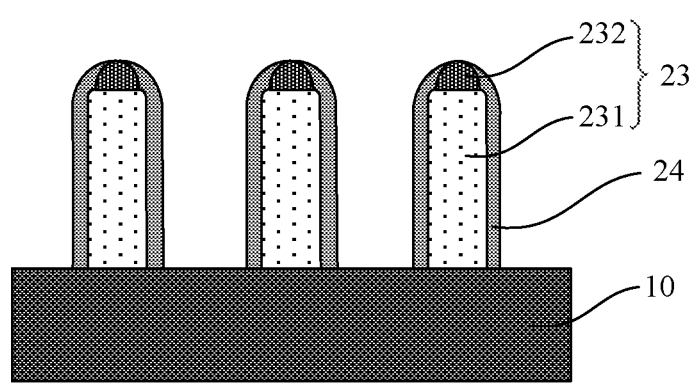
FIG. 6 is a schematic diagram of a partial cross-sectional view of a structure obtained after a part of an initial mask material layer is removed according to an embodiment of the present disclosure.

In an embodiment, Step S30: the initial mask patterns 24 are formed on the sidewalls of each of the plurality of pattern structures 23, includes the following steps:

Step S31: an initial mask material layer 241 is formed on the sidewalls of each of the plurality of pattern structures 23, an upper surface of the pattern structures 23 and an upper surface of the first dielectric layer 10, as shown in FIG. 5; and Step S32: the initial mask material layer 241 located on the upper surface of the first dielectric layer 10 and the upper surface of each of the plurality of pattern structures 23 is removed, and the initial mask material layer 241 remaining on the sidewalls of each of the plurality of pattern structures 23 forms the initial mask patterns 24, referring to FIG. 6.

As an example, the initial masking material layer 241 includes, but is not limited to, a silicon oxide layer.

Figure 7:
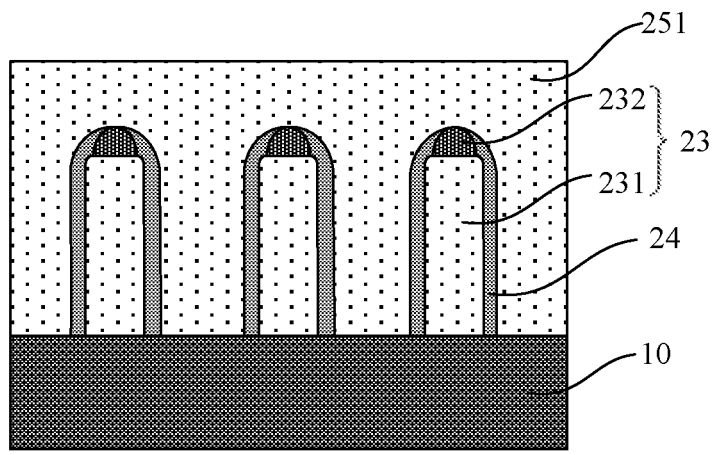
FIG. 7 is a schematic diagram of a partial cross-sectional view of formed a first filling material layer according to an embodiment of the present disclosure.

In an embodiment, Step 40: the first filling layer 25 is filled between the adjacent initial mask patterns 24 located on the sidewalls of the different pattern structures 23, includes the following steps:

Step 41: a first filling material layer 251 is formed, and the first filling material layer 251 fills gaps between the adjacent initial mask patterns 24 located on the sidewalls of the different pattern structures 23, and covers the pattern structures 23 and the initial mask patterns 24, and an upper surface of the first filling material layer 251 is higher than an upper surface of the pattern structures 23, as shown in FIG. 7; and As an example, the process of forming the first filling material layer 251 is one or more of a Chemical Vapor Deposition (CVD) process, an Atomic Layer Deposition (ALD) process, a High Density Plasma (HDP) deposition process, and a plasma enhanced deposition process. In the present disclosure, the first filling material layer 251 is preferably formed by a high density plasma deposition process.

Figure 8:
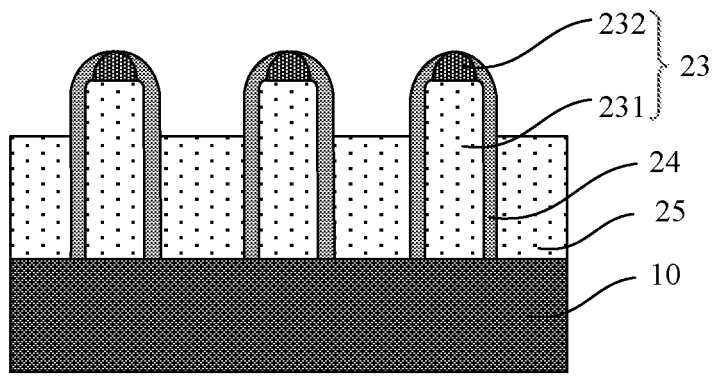
FIG. 8 is a schematic diagram of a partial cross-sectional view of a structure obtained after a part of a first filling material layer is removed according to an embodiment of the present disclosure.

Step 42: the first filling material layer 251 located on the upper surface of the pattern structures 23 and an upper surface of the initial mask patterns 24 is removed, so as to expose each of the second patterns 232, as shown in FIG. 8.

Figure 9:
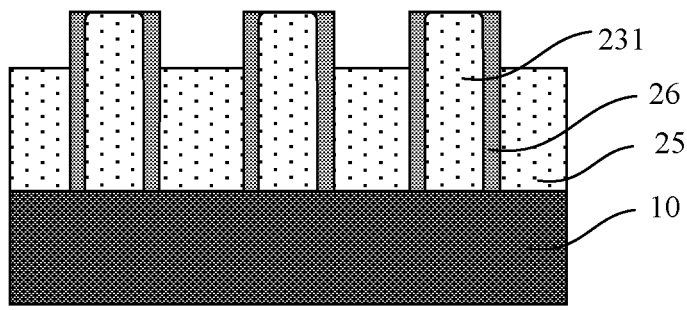
FIG. 9 is a schematic diagram of a partial cross-sectional view of a structure formed after second patterns and initial mask patterns located on sidewalls of each of the plurality of second patterns are removed according to an embodiment of the present disclosure.
Figure 10:
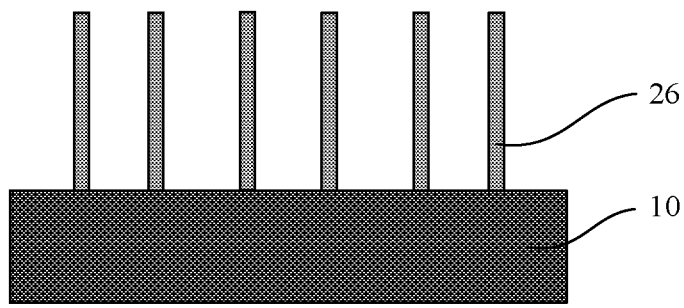
FIG. 10 is a schematic diagram of a partial cross-sectional view of formed first mask patterns on an upper surface of a first dielectric layer according to an embodiment of the present disclosure.

In an embodiment, the first filling layer 25 and the first filling material layer 251 includes, but are not limited to, a Spin-On hard mask (SOH) layer; in Step S50 and Step S60, a dry etching process of a high selectivity is used to remove the second patterns 232 and the initial mask patterns 24 located on the sidewalls of the second patterns 232, and then the first filling layer 25 and the first patterns 231 are removed, and an etch selectivity of the second patterns 232 to the initial mask patterns 24 is greater than 1, and an etch selectivity of the first filling layer 25 to the second patterns 232 is greater than 1, that is an etching rate of the first filling layer 25 is greater than an etching rate of the second patterns 232, and the etching rate of the second patterns 232 is greater than an etching rate of the initial mask patterns 24, so as to ensure that the first mask patterns 26 perpendicular to the upper surface of the first dielectric layer 10 is finally obtained as shown in FIGS. 9 and 10.

In an embodiment, further referring to FIG. 9, an upper surface of the first filling layer 25 is lower than the upper surface of the pattern structures 23, so that in the process of removing the first filling layer 25 and the first patterns 231, the remained portions of the first filling layer 25 and the first patterns 231 support the first mask patterns 26.

Figure 11:
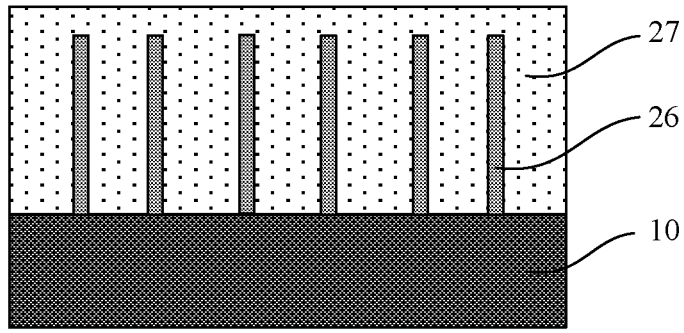
FIG. 11 is a schematic diagram of a partial cross-sectional view of formed a second filling layer according to an embodiment of the present disclosure.

In an embodiment, as shown in FIG. 11, after Step S60: the first mask patterns 26 are formed, and before Step S70: the second mask patterns 29 are formed, the method further includes the following step:

Step S601: a second filling layer 27 is formed, and the second filling layer 27 fills gaps between adjacent first mask patterns 26 and covers the first mask patterns 26.

As an example, an upper surface of the second filling layer 27 is higher than an upper surface of the first mask patterns 26, and a portion of the second filling layer 27 that is higher than the upper surface of the first mask patterns serves as a buffer layer, so that after the second mask patterns 29 are obtained, when the second mask patterns 29 are etched downwards as a mask, the first mask patterns 26 located below the second mask patterns 29 is protected from being damaged. And the second filling layer 27 includes, but is not limited to, a Spin-On hard mask (SOH) layer.

Figure 12:
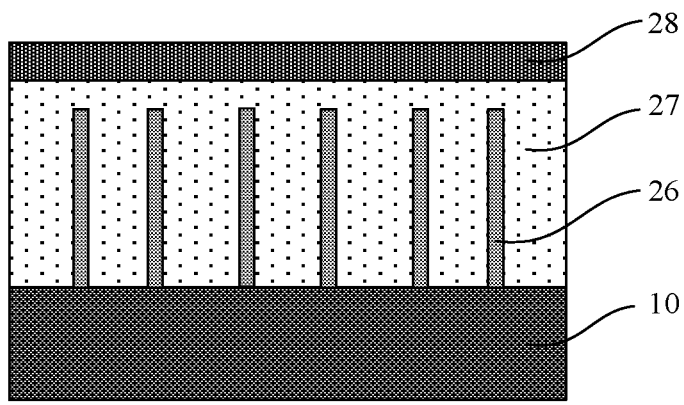
FIG. 12 is a schematic diagram of a partial cross-sectional view of formed a third dielectric layer on an upper surface of a second filling layer according to an embodiment of the present disclosure.

In an embodiment, as shown in FIG. 12, after the second filling layer 27 is formed in Step S601, and before the step of forming the second mask patterns 29, the method further includes the following step:

Step S602: a third dielectric layer 28 is formed on an upper surface of the second filling layer 27.

As an example, the third dielectric layer 28 includes, but is not limited to, a silicon oxynitride (SiON) layer.

Figure 14:
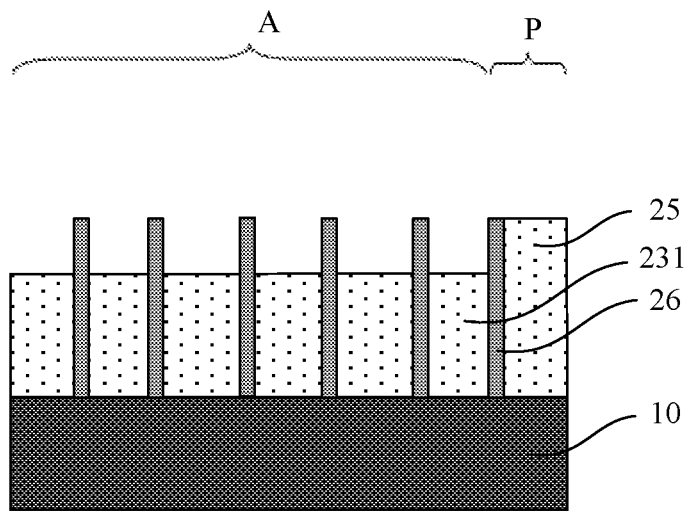
FIG. 14 is a schematic diagram of a partial cross-sectional view of a structure formed after a part of a first filling layer and a part of each of the plurality of first pattern are removed according to an embodiment of the present disclosure.

In an embodiment of the present disclosure, another embodiment is further provided, and after Step S50 of removing the second patterns 232 and the initial mask patterns 24 located on the sidewalls of each of the plurality of second patterns 232, the method further includes the following steps:

Step S501: the first filling layer 25 covers an Array region A and a Periphery region P, a part of the first filling layer 25 and a part of the first patterns 231 located in the Array region A are removed, so that the upper surface of the first filling layer 25 located in the Array region is flush with an upper surface of the first patterns 231, as shown in FIG. 14; and As an example, the upper surface of the first filling layer 25 located in the Periphery region P is flush with the upper surface of the first mask patterns 26.

Figure 15:
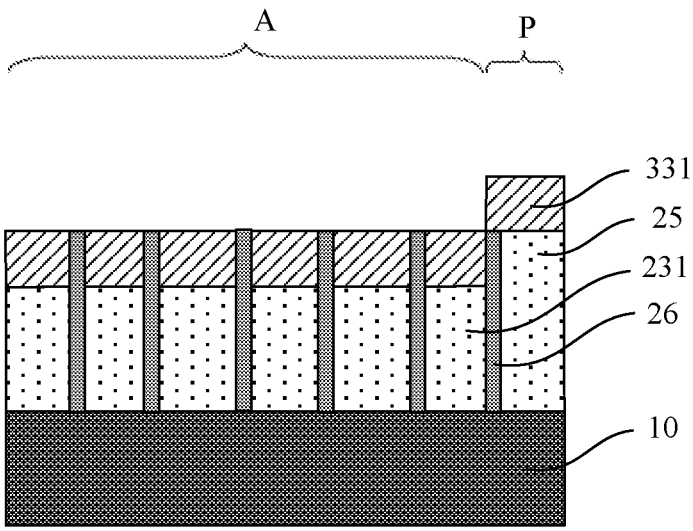
FIG. 15 is a schematic diagram of a partial cross-sectional view of formed a photoresist layer according to an embodiment of the present disclosure.
Figure 16:
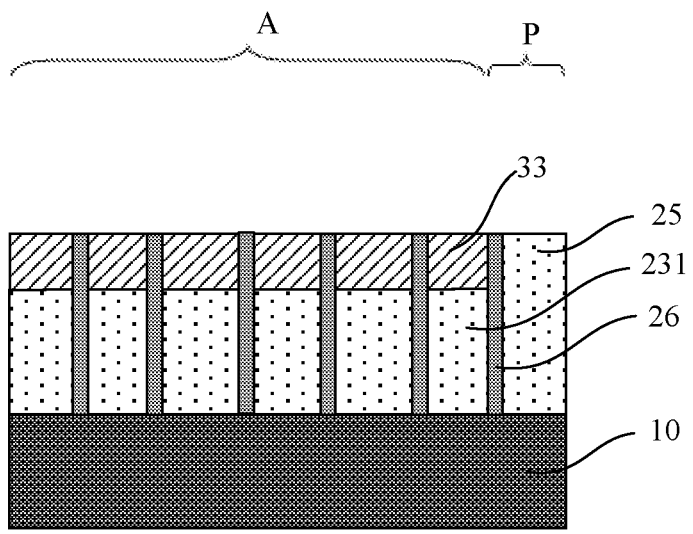
FIG. 16 is a schematic diagram of a partial cross-sectional view of formed a patterned photoresist layer according to an embodiment of the present disclosure.
Figure 17:
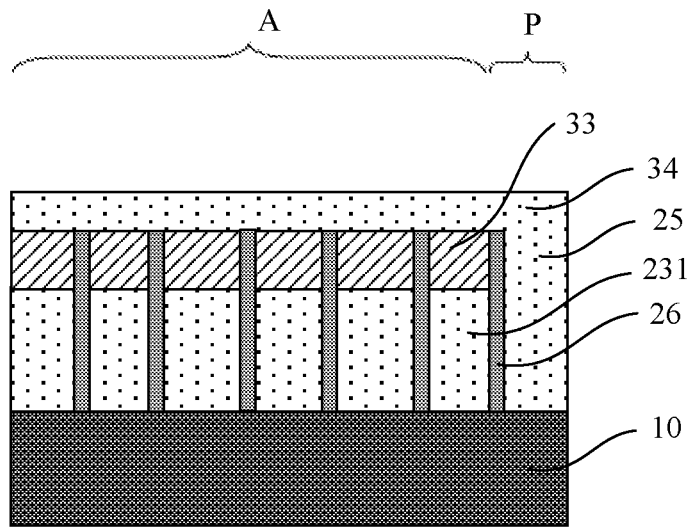
FIG. 17 is a schematic diagram of a partial cross-sectional view of formed a patterned photoresist layer according to an embodiment of the present disclosure.
Figure 18:
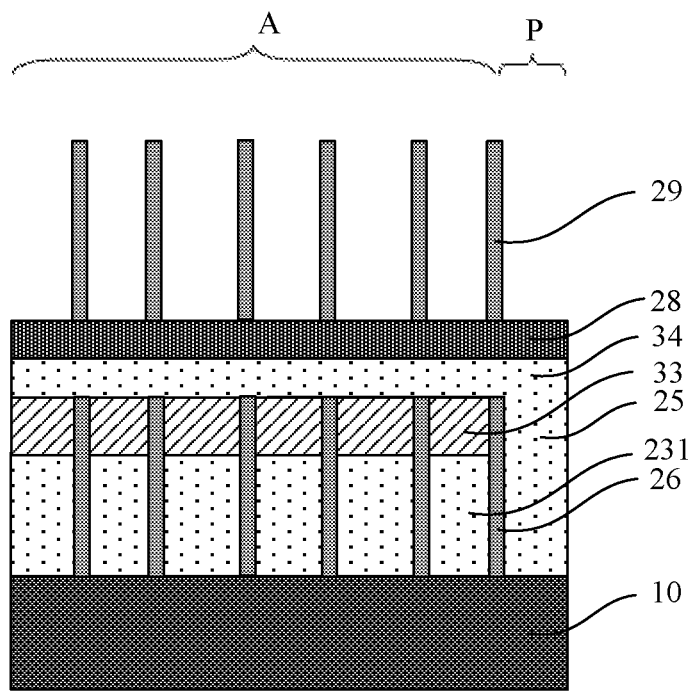
FIG. 18 is a schematic diagram of a partial cross-sectional view of formed second mask patterns according to another embodiment of the present disclosure.

Step S502: a photoresist layer 331 is formed, and the photoresist layer 331 covers an rest first filling layer 25 and an rest first patterns 231, and covers the Periphery region P, and a thickness of the photoresist layer 331 located in the Periphery region P is the same as a thickness of the photoresist 331 located in the Array region A, as shown in FIG. 15;

Step S503: the photoresist layer 331 is patterned, and the photoresist layer 331 located in the Periphery region P is removed so as to obtain a patterned photoresist layer 33, and an upper surface of the patterned photoresist layer 331 is flush with the upper surface of the first mask patterns 26, as shown in FIG. 16;

Step S504: a buffer layer 34 is formed, and the buffer layer 34 covers the upper surface of the patterned photoresist layer 331 and the upper surface of the first filling layer located in the Periphery region P, and an upper surface of the buffer layer 34 is higher than the upper surface of the first mask patterns 26, as shown in FIG. 17;

Step S505: a third dielectric layer 28 is formed on the upper surface of the buffer layer 34; and Step S506: second mask patterns 29 are formed on an upper surface of the third dielectric layer 28, as shown in FIG. 18.

Figure 13:
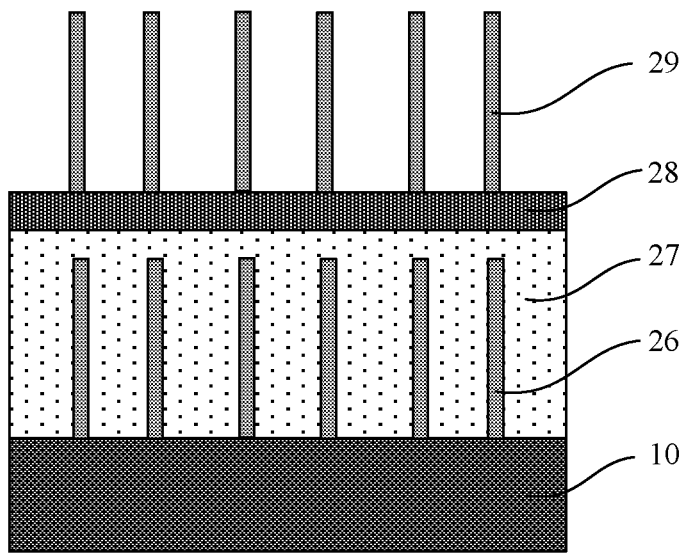
FIG. 13 is a schematic diagram of a partial cross-sectional view of formed second mask patterns according to an embodiment of the present disclosure.

In an embodiment, as shown in FIGS. 13 and 18, the first mask patterns 26 extend in a first direction, second mask patterns 29 is formed on the first mask patterns 26, the second mask patterns 29 extends in a second direction, the second direction intersects with the first direction, and an angle of intersection between the first direction and the second direction is greater than 0° and less than or equal to 90°. Specifically, the angle of intersection between the first direction and the second direction is 10°, 20°, 30°, 40°, 50° or 90°, etc.

As an example, the method for manufacturing the second mask patterns is the same as the method for manufacturing the first mask patterns, which will not be repeated here, and can refer to the manufacturing flow of the first mask patterns.

In an embodiment, after the second mask patterns 29 are formed on the first mask patterns 26 in Step S70, the method further includes the following step:

Step S80: the first dielectric layer 10 based on the first mask patterns 26 and the second mask patterns 29 is patterned, so as to obtain a target mask pattern (not shown).

In an embodiment, Step S80: the first dielectric layer 10 based on the first mask patterns 26 and the second mask patterns 29 is patterned, so as to obtain a target mask patterns, includes the following steps:

Step S81: an exposed third dielectric layer 28 based on the second mask patterns 29 is removed;

Step S82: the second filling layer 27 based on the second mask patterns 29 and the first mask patterns 26 is etched;

Step S83: the first dielectric layer 10 based on the second mask patterns 29 and the first mask patterns 26 is etched; and Step S84: the first mask patterns 26, the second mask patterns 29, a remained third dielectric layer 28 and a remained second filling layer 27 are removed, so as to obtain the target mask patterns.

Figure 19:
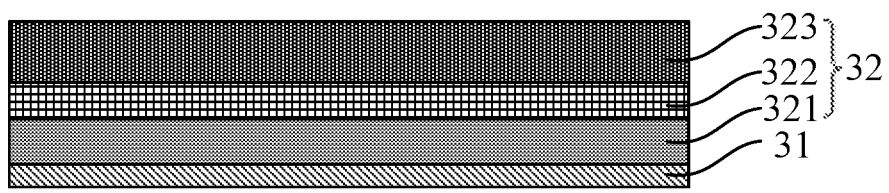
FIG. 19 is a schematic diagram of a partial cross-sectional view of a substrate and a material layer to be etched according to an embodiment of the present disclosure.
Figure 20A:
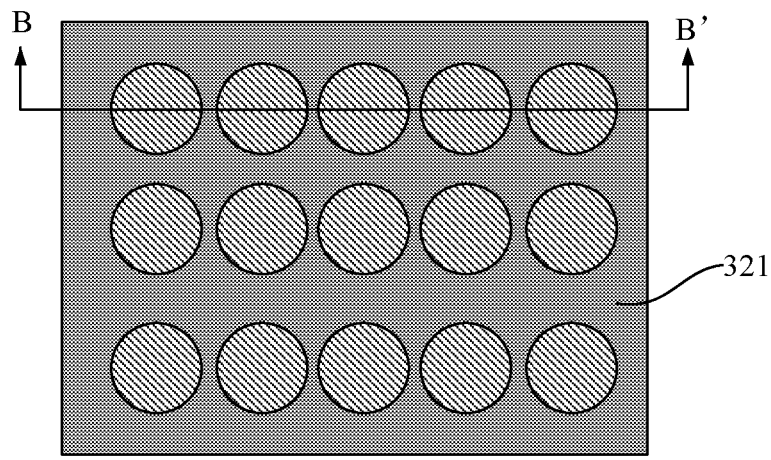
FIG. 20A is a structural schematic diagram of a top view a semiconductor structure according to an embodiment of the present disclosure.
Figure 20B:
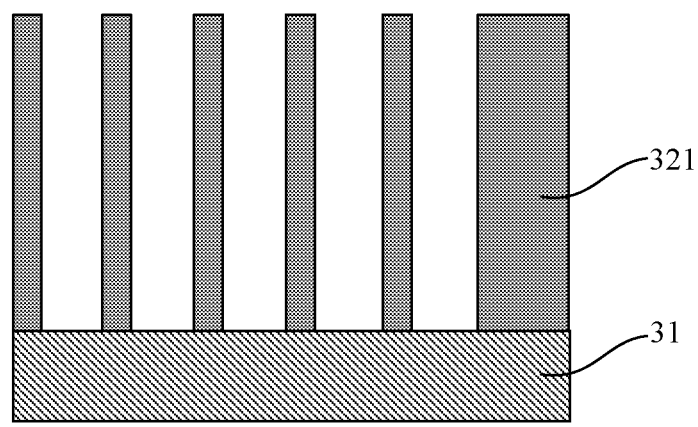
FIG. 20B is a schematic diagram of a partial cross-sectional view along the direction BB' in FIG. 20A.

In an embodiment of the present disclosure, provided is a method for manufacturing a semiconductor structure, includes the following steps:

S1: a substrate 31 is provided;

S2: a material layer to be etched 32 is formed on the substrate 31, as shown in FIG. 19;

S3: target mask patterns are formed on an upper surface of the material layer to be etched 32 by the described method for manufacturing a mask structure; and S4: the material layer to be etched 32 is etched based on the target mask patterns, so as to obtain the semiconductor structure, as shown in FIG. 20A and FIG. 20B.

In the method for manufacturing the semiconductor structure provided in the embodiment above, the substrate is provided, and the material layer to be etched is formed on the substrate; the target mask patterns are formed on the upper surface of the material layer to be etched by the described method for manufacturing the mask structure; and the material layer to be etched is etched based on the target mask patterns, so as to form the semiconductor structure having capacitor holes with a uniform aperture size and better direction consistency, and no defect such as insufficient etching exists, thereby stored power quantity in a capacitor is increased, and a manufacturing of capacitor holes of a small-sized DRAM is facilitated.

As an example, the substrate 31 includes a polysilicon base, and the material layer to be etched 32 includes a dielectric layer, the dielectric layer is multi-layered, and the dielectric layer includes a mask layer 321, a first transfer pattern layer 322 and a second transfer pattern layer 323 which are sequentially stacked from bottom to top. Further referring to FIG. 20A and FIG. 20B, the semiconductor structure includes capacitor holes, and the capacitor holes have a uniform aperture size and better direction consistency.

In an embodiment of the present disclosure, the present disclosure further provides a semiconductor structure, and the semiconductor structure is manufactured by the described method for manufacturing the semiconductor structure.

It should be noted that the embodiments above are for illustrative purposes only and are not intended to limit the present disclosure.

It should be understood that the steps described herein are not intended to be executed in a strict order, and these steps are executed in other order, unless explicitly described herein. Furthermore, at least some of the steps includes a plurality of sub-steps or a plurality of stages. These sub-steps or stages are not necessarily executed at the same time, but are executed at different times. The execution order of these sub-steps or stages is not necessarily in sequence, but is executed in turn or alternately with other steps or at least some of the sub-steps or stages of other steps.

The various embodiments in the description have been explained in a progressive manner. Each of the embodiments only emphasizes the differences from one another, and for the same or similar explanations of various embodiments, reference could be made to each other.

Various technical features of the embodiments above can be combined in any way, and in order to make the description brief, not all the possible combinations of the technical features in the embodiments above are described. However, as long as the combinations of these technical features are not contradictory, all these combinations should be considered to belong to the scope of the present description.

What is claimed is:

1. A method for manufacturing a mask structure, comprising:

forming a first dielectric layer, a sacrificial layer and a second dielectric layer which are sequentially stacked from bottom to top;

patterning the sacrificial layer and the second dielectric layer, so as to form a plurality of pattern structures, and each of the plurality of pattern structures comprising a first pattern and a second pattern which are sequentially stacked from bottom to top, wherein a width of a lower portion of the first patterns is less than a width of an upper portion of the first patterns;

forming an initial mask pattern on sidewalls of each of the plurality of pattern structures;

filling a first filling layer between adjacent initial mask patterns located on the sidewalls of different pattern structures;

removing the second patterns and the initial mask patterns located on sidewalls of each of the plurality of second patterns;

removing the first filling layer and the first patterns, so as to form first mask patterns on an upper surface of the first dielectric layer, wherein the first mask patterns extend in a first direction; and forming second mask patterns on the first mask patterns, wherein the second mask patterns extend in a second direction, and the second direction intersects with the first direction;

wherein after said forming the first mask patterns and before forming the second mask patterns, the method further comprises:

forming a second filling layer, wherein the second filling layer fills gaps between adjacent first mask patterns and covers the first mask patterns;

wherein after said forming the second filling layer and before the forming the second mask patterns, the method further comprises:

forming a third dielectric layer on an upper surface of the second filling layer;

wherein after said forming the second mask patterns on the first mask patterns, the method further comprises:

patterning the first dielectric layer based on the first mask patterns and the second mask patterns, so as to obtain target mask patterns;

wherein said patterning the first dielectric layer based on the first mask patterns and the second mask patterns, so as to obtain the target mask patterns comprises:

removing an exposed third dielectric layer based on the second mask patterns;

etching the second filling layer based on the second mask patterns and the first mask patterns;

etching the first dielectric layer based on the second mask patterns and the first mask patterns; and removing the first mask patterns, the second mask patterns, a remained third dielectric layer and a remained second filling layer, so as to obtain the target mask patterns.

2. The method according to claim 1, wherein said forming the initial mask pattern on sidewalls of each of the plurality of pattern structures comprises:
forming an initial mask material layer on the sidewalls of each of the plurality of pattern structures, an upper surface of the pattern structures and an upper surface of the first dielectric layer; and
removing the initial mask material layer located on the upper surface of the first dielectric layer and the upper surface of each of the plurality of pattern structures, wherein the initial mask material layer remaining on the sidewalls of each of the plurality of pattern structures forms the initial mask patterns.

3. The method according to claim 1, wherein said filling the first filling layer between the adjacent initial mask patterns located on the sidewalls of the different pattern structures comprises:
forming a first filling material layer, wherein the first filling material layer fills gaps between the adjacent initial mask patterns located on the sidewalls of the different pattern structures and covers the pattern structures and the initial mask patterns, and an upper surface of the first filling material layer is higher than an upper surface of the pattern structures;
and removing the first filling material layer located on the upper surface of the pattern structures and an upper surface of the initial mask patterns, so as to expose each of the second patterns.

4. The method according to claim 1, wherein an upper surface of the second filling layer is higher than an upper surface of the first mask patterns.

5. The method according to claim 1, wherein an upper surface of the first filling layer is lower than an upper surface of the pattern structures.

6. The method according to claim 1, wherein the second patterns are removed by an etching process, and in the etching process, an etch selectivity of the second patterns to the initial mask patterns is greater than 1.

7. The method according to claim 6, wherein in the etching process, an etch selectivity of the first filling layer to the second patterns is greater than 1.

8. A method for manufacturing a semiconductor structure, comprising:
providing a substrate;
forming a material layer to be etched on the substrate;
forming target mask patterns on an upper surface of the material layer to be etched; and
etching the material layer to be etched based on the target mask patterns, so as to obtain the semiconductor structure,
forming the target mask patterns on the upper surface of the material layer to be etched, comprising:
forming second mask patterns on first mask patterns;
patterning a first dielectric layer based on the first mask patterns and the second mask patterns, so as to obtain the target mask patterns,
forming the second mask patterns on the first mask patterns, comprising:
forming the first dielectric layer, a sacrificial layer and a second dielectric layer which are sequentially stacked from bottom to top;
patterning the sacrificial layer and the second dielectric layer, so as to form a plurality of pattern structures, and each of the plurality of pattern structures comprising a first pattern and a second pattern which are sequentially stacked from bottom to top, wherein a width of a lower portion of the first patterns is less than a width of an upper portion of the first patterns;
forming an initial mask pattern on sidewalls of each of the plurality of pattern structures;
filling a first filling layer between adjacent initial mask patterns located on the sidewalls of different pattern structures;
removing the second patterns and the initial mask patterns located on sidewalls of each of the plurality of second patterns;
removing the first filling layer and the first patterns, so as to form the first mask patterns on an upper surface of the first dielectric layer, wherein the first mask patterns extend in a first direction; and
forming the second mask patterns on the first mask patterns, wherein the second mask patterns extend in a second direction, and the second direction intersects with the first direction,
after forming the first mask patterns and before forming the second mask patterns, the method further comprises:
forming a second filling layer, wherein the second filling layer fills gaps between adjacent first mask patterns and covers the first mask patterns,
after forming the second filling layer and before the forming the second mask patterns, the method further comprises:
forming a third dielectric layer on an upper surface of the second filling layer;
wherein said patterning the first dielectric layer based on the first mask patterns and the second mask patterns, so as to obtain the target mask patterns comprises:
removing an exposed third dielectric layer based on the second mask patterns;
etching the second filling layer based on the second mask patterns and the first mask patterns;
etching the first dielectric layer based on the second mask patterns and the first mask patterns; and
removing the first mask patterns, the second mask patterns, a remained third dielectric layer and a remained second filling layer, so as to obtain the target mask patterns.

9. The method according to claim 8, wherein the substrate comprises a polysilicon base, and the material layer to be etched comprises a dielectric layer.

10. The method according to claim 8, wherein the semiconductor structure comprises capacitor holes.

11. A semiconductor structure, manufactured with a method for manufacturing a semiconductor structure, the method for manufacturing the semiconductor structure comprises:
providing a substrate;
forming a material layer to be etched on the substrate;
forming target mask patterns on an upper surface of the material layer to be etched; and
etching the material layer to be etched based on the target mask patterns, so as to obtain the semiconductor structure,
forming the target mask patterns on the upper surface of the material layer to be etched, comprising:
forming second mask patterns on first mask patterns;
patterning a first dielectric layer based on the first mask patterns and the second mask patterns, so as to obtain the target mask patterns, forming the second mask patterns on the first mask patterns, comprising:

forming the first dielectric layer, a sacrificial layer and a second dielectric layer which are sequentially stacked from bottom to top;

patterning the sacrificial layer and the second dielectric layer, so as to form a plurality of pattern structures, and each of the plurality of pattern structures comprising a first pattern and a second pattern which are sequentially stacked from bottom to top, wherein a width of a lower portion of the first patterns is less than a width of an upper portion of the first patterns;

forming an initial mask pattern on sidewalls of each of the plurality of pattern structures;

filling a first filling layer between adjacent initial mask patterns located on the sidewalls of different pattern structures;

removing the second patterns and the initial mask patterns located on sidewalls of each of the plurality of second patterns;

removing the first filling layer and the first patterns, so as to form the first mask patterns on an upper surface of the first dielectric layer, wherein the first mask patterns extend in a first direction; and forming the second mask patterns on the first mask patterns, wherein the second mask patterns extend in a second direction, and the second direction intersects with the first direction, after forming the first mask patterns and before forming the second mask patterns, the method further comprises:

forming a second filling layer, wherein the second filling layer fills gaps between adjacent first mask patterns and covers the first mask patterns, after forming the second filling layer and before the forming the second mask patterns, the method further comprises:

forming a third dielectric layer on an upper surface of the second filling layer;

wherein said patterning the first dielectric layer based on the first mask patterns and the second mask patterns, so as to obtain the target mask patterns comprises:

removing an exposed third dielectric layer based on the second mask patterns;

etching the second filling layer based on the second mask patterns and the first mask patterns;

etching the first dielectric layer based on the second mask patterns and the first mask patterns; and removing the first mask patterns, the second mask patterns, a remained third dielectric layer and a remained second filling layer, so as to obtain the target mask patterns.

12. The semiconductor structure according to claim 11, wherein the substrate comprises a polysilicon base, and the material layer to be etched comprises a dielectric layer.

13. The semiconductor structure according to claim 11, wherein the semiconductor structure comprises capacitor holes.

* * * * *